(12) United States Patent
Petrovic (10) Patent No.: US 8,223,046 B2
(45) Date of Patent: Jul. 17, 2012

(54) METHOD AND SYSTEM FOR ACCELERATED ANALOG TO DIGITAL CONVERSION

(75) Inventor: Branislav Petrovic, La Jolla, CA (US)

(73) Assignee: Entropic Communications, Inc., San Diego, CA (US)

(*) Notice: Subject to any disclaimer, the term of this patent is extended or adjusted under 35 U.S.C. 154(b) by 71 days.

(21) Appl. No.: 12/822,977

(22) Filed: Jun. 24, 2010

(65) Prior Publication Data

US 2011/0037628 A1 Feb. 17, 2011

Related U.S. Application Data

(60) Provisional application No. 61/234,188, filed on Aug. 14, 2009.

(51) Int. Cl.
*H03M 1/10* (2006.01)
(52) U.S. Cl. .......................... 341/120; 341/118; 341/155
(58) Field of Classification Search .......... 341/118–121, 341/155
See application file for complete search history.

(56) References Cited

U.S. PATENT DOCUMENTS

| | | | |
|---|---|---|---|
| 5,017,920 A | 5/1991 | French | |
| 6,127,955 A * | 10/2000 | Handel et al. | 341/120 |
| 6,380,874 B1 * | 4/2002 | Knudsen | 341/118 |
| 6,424,276 B1 * | 7/2002 | Munoz et al. | 341/120 |
| 6,445,319 B1 * | 9/2002 | Bugeja | 341/138 |
| 6,473,012 B2 | 10/2002 | Hellberg et al. | |
| 6,661,365 B1 * | 12/2003 | Bugeja | 341/160 |
| 6,970,120 B1 * | 11/2005 | Bjornsen | 341/120 |
| 7,126,510 B2 * | 10/2006 | Alon et al. | 341/120 |
| 7,782,235 B1 * | 8/2010 | Velazquez | 341/118 |
| 7,924,209 B2 * | 4/2011 | Kuo et al. | 341/172 |
| 2001/0026233 A1 * | 10/2001 | Hellberg et al. | 341/120 |
| 2002/0000925 A1 * | 1/2002 | Martin et al. | 341/122 |
| 2004/0208249 A1 | 10/2004 | Risbo et al. | |
| 2008/0272952 A1 | 11/2008 | Wood | |
| 2009/0085785 A1 * | 4/2009 | Gerfers et al. | 341/143 |
| 2009/0121907 A1 * | 5/2009 | Kuramochi et al. | 341/120 |

* cited by examiner

*Primary Examiner* — Linh Nguyen
(74) *Attorney, Agent, or Firm* — Bruce W. Greenhaus (57) ABSTRACT

Techniques for accelerated processing associated with analog to digital signal conversion are disclosed. Accelerated processing is provided for sample-and-hold and track-and-hold circuits used with analog to digital converters in various embodiments. An abbreviated sampling state, an abbreviated reset state, or both are employed in various embodiments. By accelerating processing so as to avoid the need for waiting for a signal to settle within a predetermined tolerance, errors of different types may be incurred. Such errors are determined during calibration and stored for future retrieval and error compensation. Techniques for online and offline calibration are disclosed, whereby calibration may or may not impact normal signal conversion processing. Techniques disclosed herein find broad applicability in analog to digital conversion and yield faster processing in a variety of contexts.

2 Claims, 12 Drawing Sheets

METHOD AND SYSTEM FOR ACCELERATED ANALOG TO DIGITAL CONVERSION

CROSS-REFERENCE TO RELATED APPLICATIONS

This application claims priority under 35 U.S.C. §119(e) from Provisional Application Ser. No. 61/234,188, filed Aug. 14, 2009, the entirety of which is hereby incorporated by reference herein.

FIELD

This disclosure is directed generally to signal processing techniques, and in particular to accelerating processing related to analog to digital conversion using error compensation.

BACKGROUND

Analog-to-digital converters (ADCs) are used in a wide range of signal processing applications and are available in a variety of implementations. Because practical ADCs cannot perform instantaneous conversion, a device known as a sample-and-hold (SH) circuit is often used to sample an analog input signal and hold the signal at a constant value for a specified time period, during which time the ADC may reliably perform analog-to-digital conversion.

Figure 1:
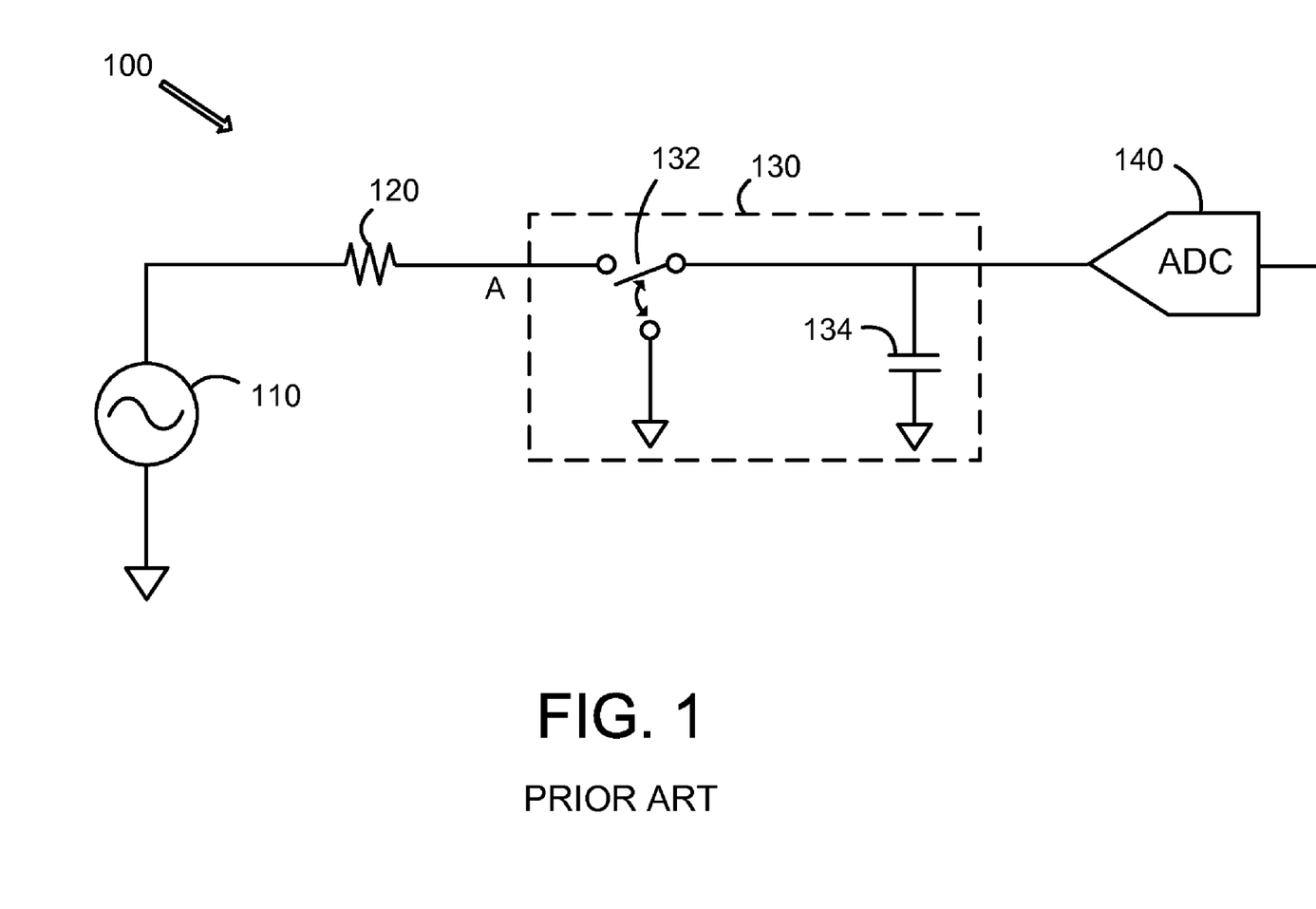
FIG. 1 is a circuit diagram illustrating a known sample-and-hold (SH) circuit.

FIG. 1 is a circuit diagram illustrating a known SH module. The module 100 includes a voltage source 110 with a resistor 120 in series (representing the source impedance, which, in general, can be a complex impedance having a reactive component), a SH circuit 130, and an ADC 140. SH circuit 130 includes a capacitor 134. The capacitor 134 may be referred to as a sampling capacitor or a hold capacitor.

A switch 132 switches the SH circuit 130 between three states: (1) the sampling state, when the switch 132 is coupled to the signal node A; (2) the holding state, when the switch 132 is in an open switch position, not shown in FIG. 1; and (3) a reset state, when the switch 132 couples the ADC 140 to a ground node (or in general to some reference node, particularly in the case of differential signals and circuits, when an explicit ground node is not used) to discharge the capacitor 134 and thus prepare the SH circuit 130 for a new sample.

The capacitor 134 obtains or acquires an analog input voltage provided at node A in the sampling state (also sometimes referred to as an acquisition state or a charging state) and stores this voltage during the holding state. The SH circuit 130 is a simplified representation of an SH circuit, allowing for easier description of the principle of operation. In practice, the SH circuit 130 may be more complex. For instance, the circuit 130 may have separate sample and hold (or load) capacitors. Often, such a circuit will have another capacitor used to transfer the charge from the sampling capacitor to the load capacitor. Such transfer is often accomplished by additional switches. During the holding state, the voltage on the capacitor settles (stabilizes) to a nearly constant value. Such a stable voltage signal may be processed by the ADC 140 and subsequent (downstream) system elements. The ADC 140 typically quantizes the signal to one of the $2^N$ discrete values. N is the number of bits output from the ADC 140. The value of N thus determines the bit resolution. The quantization is followed by encoding of the quantized level into digital samples (or digital code or word). Often, ADCs have a built-in sample and hold function. Accordingly, the combination of SH 130 and ADC 140 is referred to as a sampling ADC, or simply an ADC.

Figure 2:
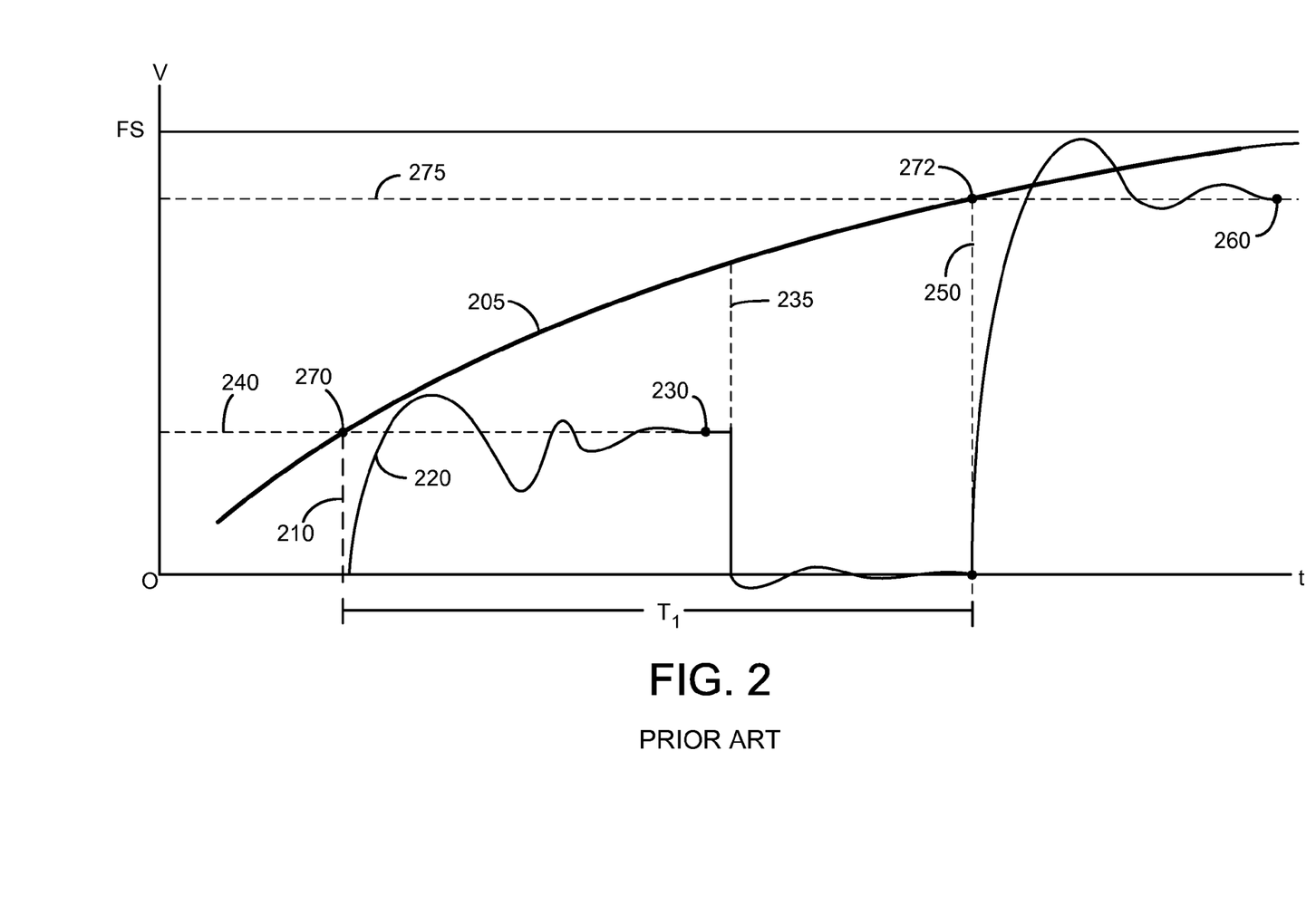
FIG. 2 is a signal trace showing typical operation of a known SH circuit.

FIG. 2 is a signal trace showing typical operation of the SH circuit 130. A prior art module such as the module 100 may be used to sample and hold a varying analog input voltage signal 205 at successive periods. An input voltage signal 205 that corresponds to a voltage at node A in FIG. 1, may vary over a specified dynamic range, e.g., between zero voltage and a full scale voltage FS. A "sampling period" begins at a time 210, with the objective of obtaining the voltage 240 of the input signal 205 corresponding to that time instant, and ends at a time 235. The sampling period comprises a sampling state, a holding state and a reset state. In the sampling state, SH circuit 130 charges. The sampling state (i.e. the charging of the capacitor 134) must be fast enough so that the input signal does not change significantly during the acquisition, otherwise a sampling error will occur.

Typically, the change in the input signal level is limited to less than 1 LSB. Upon completion of acquisition, the switch 132 opens and the capacitor 134 holds the charge in the holding state. During the holding state the voltage signal associated with the SH circuit 130 (and specifically the capacitor 134 therein) settles. As used herein, "settles" means stabilizes within predefined voltage levels or an associated tolerance. At point 230, the voltage 220 settles (e.g., remains stable to within one least significant bit (LSB) of the ADC). For example, if a 10-bit ADC having $2^{10}$=1024 possible quantization values is used, the voltage will considered to have settled when the voltage remaining within $2^{-10}$ times the operating voltage range of the ADC (i.e., within a tolerance of $+/-0.5*2^{-10}*$the operating range of the ADC with respect to the value that the input signal would settle given infinite time). When the voltage has settled, it may be suitable for digital conversion and encoding (i.e. for processing by downstream system components). At a time 235, the SH circuit 130 is reset by setting the switch 132 to the ground position. The voltage on the capacitor 134 may settle to zero before the next sampling period begins.

In FIG. 2, a sampling period $T_1$ is shown, corresponding to a sampling frequency $fs_1$ (i.e., $T_1=1/fs_1$). Thus, an input signal 205 is sampled periodically (e.g., at the points 270 and 272 spaced in time by $T_1$). The combination of the sampling state and the holding state (e.g., between times 210 and 235) is referred to herein as an "attack". The reset state (between times 235 and 250) is considered the "release". The process repeats in the next sampling period, which starts at time 250, when the module 100 seeks to determine (sample and hold) the input voltage at point 272. The input voltage settles at a value 260 that is approximately equal to the level at the point 272. The digital conversion is then executed in the same manner as in the previous period described above.

Another known approach used to pre-process an analog signal for an ADC or other downstream system elements is known as track-and-hold (TH). Like an SH module 130, a TH module samples a signal by charging a capacitor. However, a TH module has only two states: (1) a tracking state, when the sampler is coupled to the signal and "follows" or tracks the signal; and (2) a holding state, when the sampler is disconnected from the signals and stores the charge making it available for digital conversion. The TH module does not switch to a reset state during each sampling period. Rather, the TH module transitions from a settled (held) sampled voltage level directly into attacking another sample.

One problem that results from the use of both SH and TH modules is that due to the time required for the voltage to settle, it takes a relatively long time to accurately capture the voltage level that the module desires to determine and digitize. The settling time can dominate the length of the sample period, putting a limit on the sample frequency. Accordingly, there is a need to shorten the sample period and thus increase the sample frequency.

SUMMARY

In some embodiments, an analog to digital converter (ADC) is calibrated by providing an analog calibration value having a known accuracy to a sample-and-hold (SH) circuit, sampling the analog calibration value with the SH circuit to provide an analog calibration signal before an output of the SH circuit settles within a predetermined tolerance, converting the analog calibration signal to a digital conversion signal with the ADC, and storing a difference between the digital calibration value and the digital conversion signal in a table in a memory.

In some embodiments, a signal processing method includes providing an analog input signal to an input of a sample-and-hold (SH) circuit, charging the SH circuit based on the analog input signal, and converting an output of the SH circuit to a digital output signal at a pre-settled time before the output of the SH circuit settles within a predetermined tolerance. A sampling error corresponding to the digital output signal is retrieved, and the digital output signal is corrected to compensate for the retrieved sampling error.

In some embodiments, an ADC is calibrated by providing an analog calibration value to a sample-and-hold (SH) circuit. The SH circuit is then charged until an output of the SH circuit settles within a predetermined tolerance. The SH circuit is discharged. The output of the SH circuit is converted to a digital conversion signal with the ADC after discharging and before the output of the SH circuit settles within the predetermined tolerance. Finally, the digital conversion signal is stored in a memory of a digital signal processor (DSP).

In some embodiments, a signal processing method includes providing an analog input signal to an input of a sample-and-hold (SH) circuit. The SH circuit is charged based on the analog input signal. The output of the SH circuit is converted to a digital output signal. The SH circuit is reset at an end of the sampling state. The SH circuit is charged after resetting and before the output of the SH circuit settles within the predetermined tolerance. An error corresponding to the digital output signal is retrieved and associated with the charging the SH circuit after resetting. Finally, the digital output signal is corrected to compensate for the retrieved error.

In some embodiments, an ADC is calibrated by providing an analog calibration value to a sample-and-hold (SH) circuit. The SH circuit is charged until an output of the SH circuit settles within a predetermined tolerance. The SH circuit is discharged. The output of the SH circuit is converted to a digital conversion signal with the ADC after discharging and before the output of the SH circuit settles within the predetermined tolerance. Finally, the digital conversion signal is stored in a table in a memory of a digital signal processor (DSP).

In some embodiments, a signal processing method includes providing an analog input signal to an input of a sample-and-hold (SH) circuit. The SH circuit is charged based on the analog input signal. An output of the SH circuit is converted to a digital output signal. The SH circuit is reset at an end of the sampling state. The SH circuit is charged after resetting and before the output of the SH circuit settles within the predetermined tolerance. An error corresponding to the digital output signal is retrieved and associated with the charging of the SH circuit after resetting. Finally, the digital output signal is corrected to compensate for the retrieved error.

In some embodiments, a circuit includes an input node, and ADC, a digital to analog converter (DAC), a sample-and-hold (SH) circuit, and a digital signal processor (DSP). The input node has a variable analog input voltage. The SH circuit includes a capacitor coupled to the ADC and a switch that switches the SH circuit between a calibration state, a sampling state, and a reset state by coupling the ADC and the capacitor to the DAC, the input node, or a ground node, respectively. The DSP is coupled to the DAC and the ADC and includes a control logic, a memory, and a correction module. The control logic provides at least one digital calibration value to the DAC in the calibration state. The memory that stores at least one error associated with the ADC in the calibration state. The correction module that corrects an output of the ADC based on the at least one stored error.

In some embodiments, a circuit includes an input node, first and second ADCs, first and second SH circuits, a DAC, and a DSP. The input node has a variable analog input voltage. The first sample SH circuit includes a first capacitor, coupled to the first ADC, and a first switch that switches the first SH circuit, based on a control signal, between a sampling state and a reset state by coupling the first ADC and the first capacitor to the input node or a ground node, respectively. The second SH circuit is coupled to the second ADC and comprises a second capacitor, coupled to the second ADC, and a second switch, controlled by the control signal and that switches the second SH circuit between a calibration state and a reset state by coupling the second ADC and the second capacitor to the DAC or the ground node, respectively. The DSP is coupled to the first and second ADCs and the DAC. The DSP includes a control logic, a memory, and a correction module. The control logic provides at least one digital calibration value to the DAC. The memory stores at least one error associated with the second ADC. The correction module corrects an output of the first ADC based on the at least one stored error.

In some embodiments, a circuit includes an input node, an ADC, first and second DACs, a track-and-hold (TH) circuit, and a DSP. The input node has a variable analog input voltage. The TH circuit includes a capacitor coupled to the ADC and a switch that switches the TH circuit between a calibration state and a sampling state by coupling the ADC and the capacitor to the one of the DACs or to the input node, respectively. The DSP is coupled to the DACs and the ADC. The DSP includes a control logic, a memory, and a correction module. The control logic provides at least one digital calibration value to each of the DACs in the calibration state. The memory stores at least one error associated with the ADC in the calibration state. The correction module corrects an output of the ADC based on the at least one stored error.

In some embodiments, a circuit includes an input node, first and second ADCs, first and second TH circuits, first and second DACs, and a DSP. The input node has a variable analog input voltage. The first TH circuit includes a first capacitor, coupled to the first ADC, and a first switch that switches the first TH circuit, based on a control signal, into a sampling state by coupling the first ADC and the first capacitor to the input node. The second TH circuit is coupled to the second ADC and includes a second capacitor, coupled to the second ADC, and a second switch, controlled by the control signal and that switches the second SH circuit in a calibration state by coupling the second ADC and the second capacitor to one of the DACs. The DSP is coupled to the ADCs and the DACs. The DSP includes a control logic, a memory, and a correction module. The control logic provides at least one digital calibration value to each of the DACs. The memory stores at least one error associated with the second ADC. The correction module corrects an output of the first ADC based on the at least one stored error.

BRIEF DESCRIPTION OF THE DRAWINGS

The following will be apparent from elements of the figures, which are provided for illustrative purposes and are not necessarily to scale.

DETAILED DESCRIPTION

This description of the exemplary embodiments is intended to be read in connection with the accompanying drawings, which are to be considered part of the entire written description.

Figure 3:
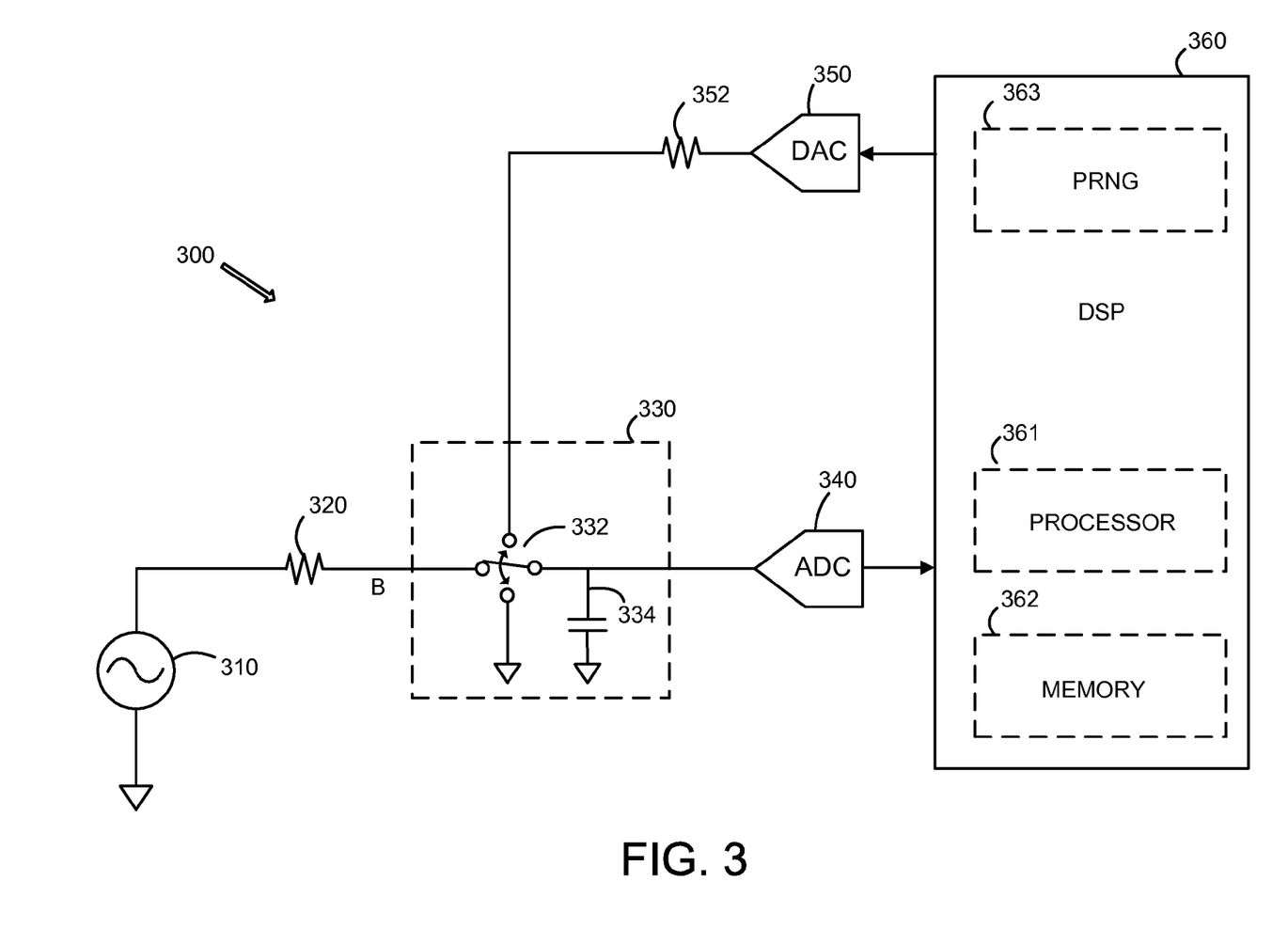
FIG. 3 is a circuit diagram in accordance with an exemplary embodiment in an online sample-and-hold (SH) configuration.

FIG. 3 is a circuit diagram in accordance with one embodiment. A circuit 300 includes a voltage source 310 with a resistor 320 in series. The resistor represents a source impedance, which in general can be a complex impedance having a reactive part, however, for simplicity, a resistor is shown in lieu of a general complex impedance, which may be present in this and other circuits disclosed throughout this disclosure. In addition, the circuit 300 includes a sample-and-hold (SH) circuit 330, an analog-to-digital converter (ADC) 340, a digital-to-analog converter (DAC) 350, and a digital signal processor (DSP) 360. DSP 360 may be a DSP known to one of ordinary skill in the art that includes a processor 361 and a memory 362 that stores digital data. SH circuit 330 includes a capacitor 334, which may be referred to as a sampling capacitor or a hold capacitor. The capacitor 334 acquires an analog input voltage provided at node B in a sampling state and store that voltage in the holding state. After a certain amount of time, the voltage signal corresponding to the voltage on capacitor 334 may be processed by ADC 340. A switch 332 switches SH circuit 330 through three states: from the sampling state, when switch 332 is coupled to signal node B, to a holding state (when switch 332 is in open position, not shown in FIG. 3) and to a reset state, in which ADC 340 is coupled to a ground node (or in general to some reference node, particularly in the case of differential signals and circuits, when an explicit ground node is not used; for simplicity, a ground node in lieu of a reference node, as well as single-ended signal representation in lieu of differential connections may be used in other circuits throughout this disclosure) and charge is removed from capacitor 334 to prepare SH circuit 330 for a new sample. The new sampling cycle starts with the switch going from the ground node position to the signal node position, and the sampling process repeats.

In one embodiment, the SH circuit 330 may be configured in a calibration state that is not available in the known SH circuit 130 of FIG. 1. The configuration of circuit 300 may be referred to as an "online" configuration, because calibration may occur using the same data path involving ADC 340 as actual sampling, i.e., the same ADC 340 is used for calibration and for processing of actual samples. In the calibration state, switch 332 couples ADC 340 to DAC 350 via resistor 352. If impedances associated with resistors 320 and 352 are not matched, a systematic scaling error may occur in an output voltage, which error may be corrected by a scale factor compensation as is known to one of ordinary skill in the art. In some embodiments, a DAC output is not presented to ADC 340 until a reset state has resulted in complete voltage discharge, in order to mitigate or eliminate dependence of error compensation on time (i.e., "history" problems, to remove the residual charge from the prior state thus eliminating its effect on the current charge of the capacitor). DAC 350 may be a relatively high resolution and relatively slow device compared to ADC 340. For example, ADC 340 may have 10 bits of resolution, and DAC 350 may have 16 bits of resolution and take a longer time than ADC 340 to provide a stable (settled) output. In the calibration state, DAC 350 provides a known calibration signal to ADC 340 as described in detail below with reference to FIG. 4. The output of DAC 350 may be presented to ADC 340 for a long enough time to result in full charging. The resulting output from ADC 340 is stored in DSP 350 for future reference. Later, if the same output is observed at ADC 340, DSP 350 may compensate the output by retrieving pre-stored information. Further details regarding such storage, retrieval, and compensation are provided further below with reference to FIGS. 4 and 5.

Figure 4:
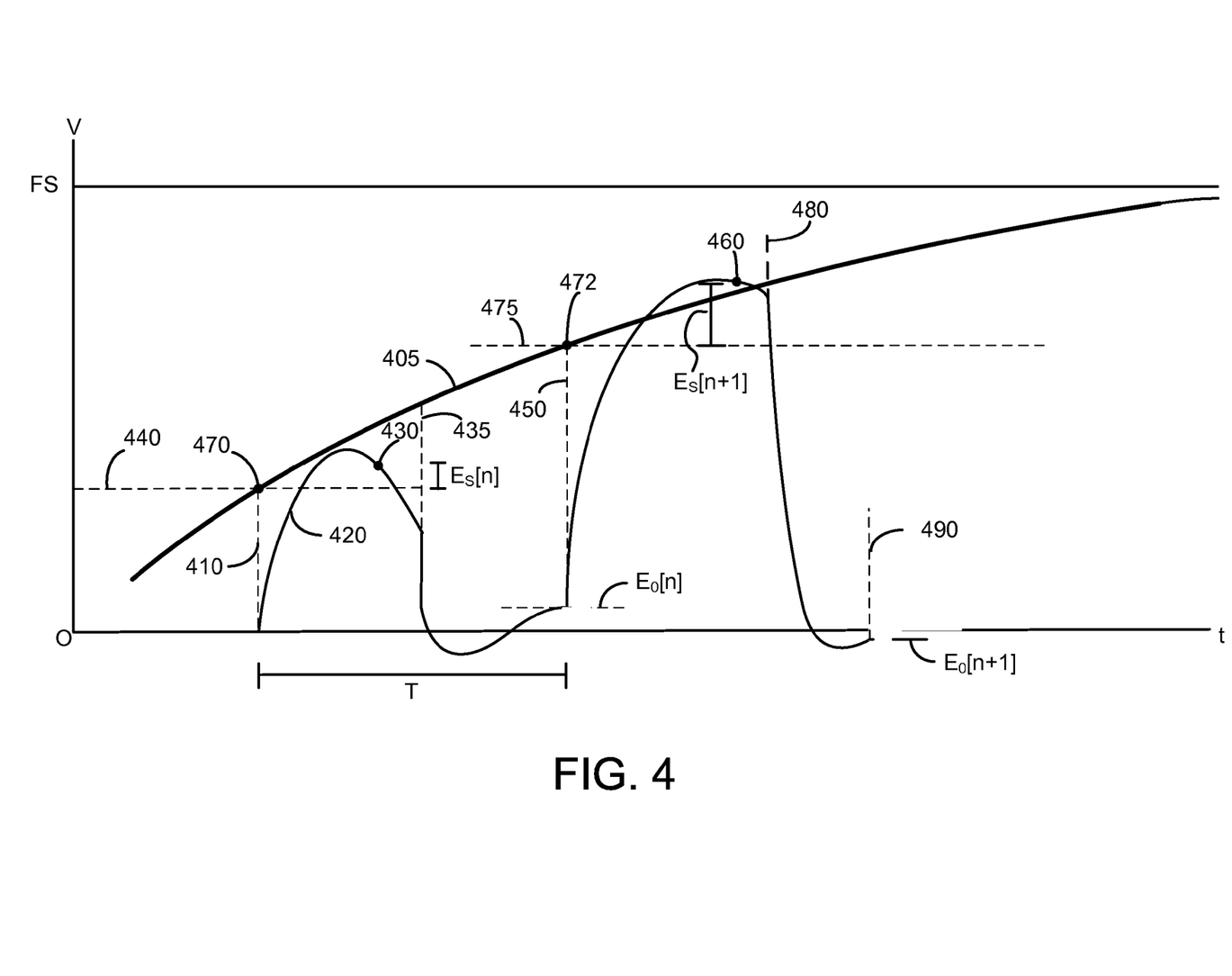
FIG. 4 is a signal trace in accordance with an exemplary embodiment.

FIG. 4 is a signal trace in accordance with one embodiment. Referring to FIG. 4, an analog input voltage signal 405 corresponding to node B in FIG. 3 varies over a specified dynamic range, e.g., between zero voltage and full scale voltage FS. A sampling period begins at time 410, with the objective of obtaining the voltage 440 of the input signal 405 corresponding to that time instant (i.e., the voltage of analog input signal 405 at point 470, which may be referred to as a sampled value 470). SH circuit 330 charges during a sampling state and the acquired charge is stored during the holding state. In some embodiments, the voltage provided by SH circuit 330 in holding state is available (to downstream system components) before the voltage has settled, e.g., as indicated at point 430; this output voltage may be referred to as a pre-settled SH output voltage. By providing a pre-settled voltage to ADC 340 rather than waiting for the voltage to settle, some embodiments provide accelerated processing relative to prior art techniques. In other words, various embodiments provide samples of analog input voltage in reduced time relative to the prior art, substantially increasing the speed of an ADC, e.g., by a factor of two or more, while correcting the error that may have occurred due to accelerated process.

The precise time at which such a pre-settled voltage is captured may vary in various embodiments; any time before the voltage has settled may be used in order to accelerate processing. In some embodiments, the pre-settled voltage may be captured (provided to downstream system components) at a point in time corresponding to a peak overshoot of voltage 420 relative to the true level 440. Using such a point of peak overshoot, which occurs prior to point 430 in FIG. 4, may reduce sensitivity to phase noise or time jitter of the clock or sampling aperture, because the first derivative in respect to time of the voltage is zero at that point. From sample to sample, the peak overshoot may occur around the same position in time in respect to the start of each sampling cycle. The peak location may be predominantly independent of the magnitude or step of the level change from sample to sample, thus enabling optimum sampling of the peak at regular, equidistant intervals. The voltage at point 430 may differ from the "true" voltage 440 by an error $\epsilon_s[n]$ that exceeds one least significant bit (LSB) of resolution. $\epsilon_s[n]$ may be referred to as a sampling error corresponding to the $n^{th}$ period. DSP 360 may compensate such an error as described further below with reference to FIG. 5.

SH circuit 330 enters a reset state at time 435, during which charge is removed from capacitor 334 to prepare for a next sampling state. The reset state may end earlier than according to prior art techniques. For example, the reset state may end at time 450. At this time, voltage 420 has not yet settled to zero in some embodiments but rather may have a nonzero value $\epsilon_0[n]$ that may be referred to as a reset error corresponding to the $n^{th}$ period. At time 450, SH circuit 330 enters the sampling state in the next period and charges with the objective of providing voltage 475 corresponding to point 472. Again, after the sampling state, the holding state is cut off prematurely (relative to the prior art, i.e., before the voltage has settled, at which time the conversion to digital code is executed), resulting in a sampling error $\epsilon_s[n+1]$. The reset error $\epsilon_0[n]$ from the preceding period may contribute to this sampling error $\epsilon_s[n+1]$, because a nonzero starting point for the sampling state provides a bias (offset). FIG. 4 shows no such bias at time 410 for convenience and clarity of illustration. At time 480, SH circuit 480 resets again. At time 490, a new period begins, and a voltage $\epsilon_0[n+1]$ at that time is another reset error.

The sampling and reset states may constitute successive periods having combined duration of T as shown in FIG. 4, where T is less than $T_1$ from FIG. 2. In other words, a sampling frequency fs=1/T of ADC 340 is greater than sampling frequency $fs_1$ of known ADC 140.

With accelerated processing as in various embodiments, using a pre-settled voltage that is above the true voltage (the voltage of the input signal at the start of the sampling state, or, equivalently, the settled voltage) may result in clipping, e.g., if the pre-settled voltage corresponds to an overshoot relative to the true voltage. In order to mitigate the effects of clipping, which may reduce dynamic range, the output voltage signal obtained in some embodiments may be scaled or backed-off so that the peak of overshoot is less than the full scale voltage FS. Similar signal backoff may be required with traditional sampling, where similar overshoot during the attack process may be exhibited.

Figure 5:
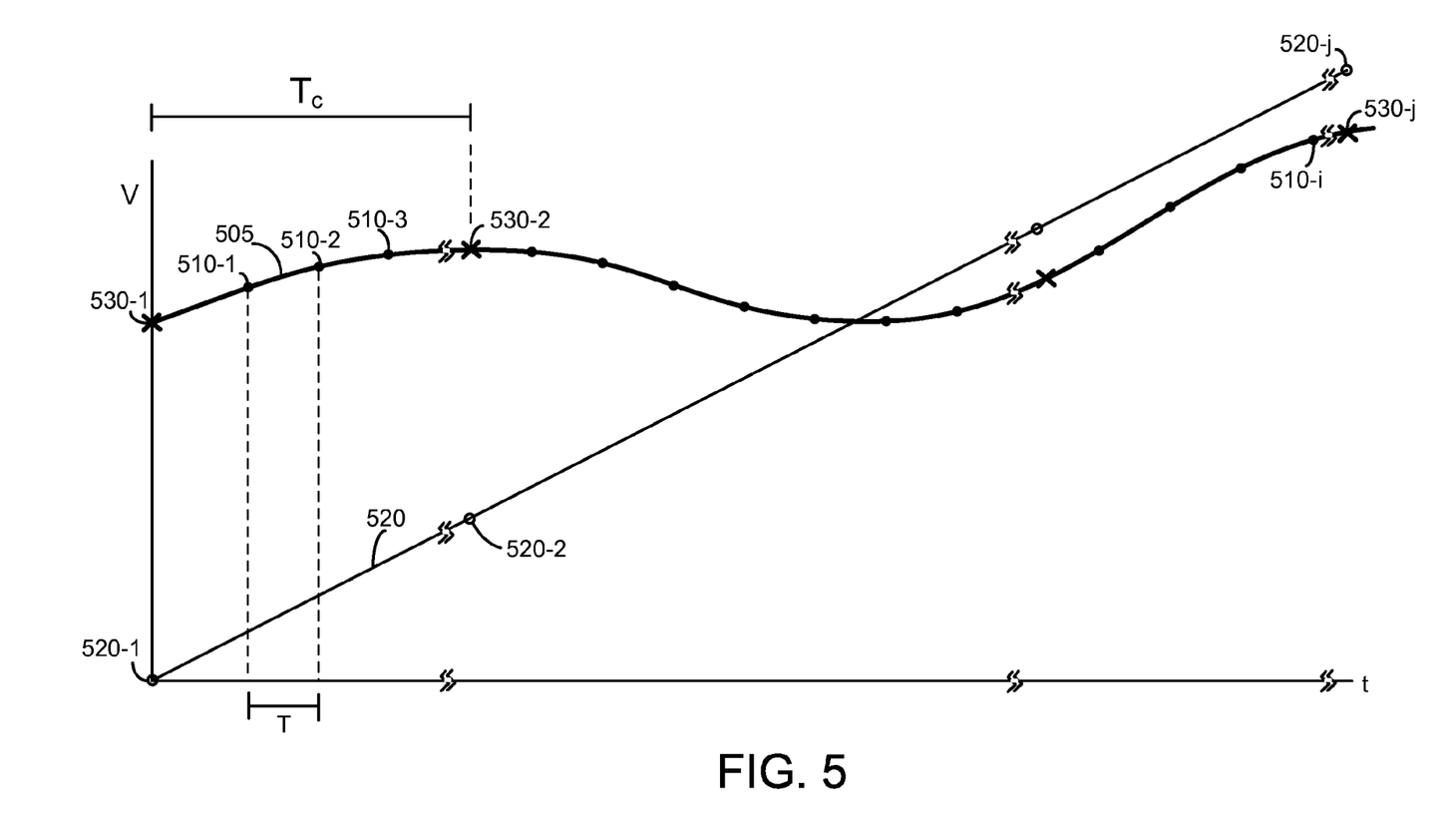
FIG. 5 is a voltage-time plot illustrating calibration in accordance with an exemplary embodiment.

FIG. 5 is a voltage-time plot illustrating calibration in accordance with an exemplary embodiment. An analog input voltage signal 510 is provided, e.g., at node B of FIG. 3. At certain times denoted by dots (points) in FIG. 5, input signal 510 is sampled (and held) by SH circuit 330. Such signal values 510-1, 510-2 . . . 510-i occur periodically and are separated in time by an interval T, which may correspond to interval T in FIG. 4. In some embodiments, a sampling state and a reset state occur between sampling times, e.g., between signal values 510-1 and 510-2. Thus, switch 332 may couple ADC 340 to node B and later to ground during a sampling period T. FIG. 5 shows that certain time slots, designated by crosses, are reserved for calibration. Circuit 300 is in a calibration state for calibrations 530-1, 530-2 . . . 530-j (generally 530); at these times, ADC 340 is coupled to DAC 350 via resistor 352 and is decoupled from the input voltage at node B.

DAC 350 provides calibration voltages, having values specified by DSP 360, to ADC 340 during calibrations. Because DAC 350 is highly accurate, its outputs are essentially "truth" data (i.e., essentially error-free) that ADC 340 may process so that errors may be determined and catalogued systematically. In some embodiments, DAC outputs 520-1, 520-2 . . . 520-j (generally 520) that span the entire dynamic range of ADC 340 are provided to the ADC to calibrate the ADC over all possible inputs. The term "calibration voltage" may refer to either the input or the output of DAC 350, with the understanding that the input is in a digital representation and the output is in an analog representation, and the two are nearly identical due to the high accuracy of the DAC 350. For example, if ADC 340 is a 10-bit ADC having $2^{10}$=1024 quantization levels, DAC 350 may provide outputs 520 at all 1024 levels. In the example of FIG. 5, a linear (ramp) function is shown for the DAC output; however, in other embodiments, other functions such as a sinusoid or any other function may be employed. In some embodiments, DAC outputs 520 may be presented to ADC 340 in a pseudorandom manner as in frequency hopping or spread spectrum techniques in order to reduce spurious harmonic content (spurs) in a power spectrum. Thus, DAC 350 may be instructed to provide a specified analog value based on an output of a pseudorandom number generator (PRNG) 363 of DSP 360. In some embodiments, such pseudorandom values may be pre-stored in a table in DSP 360.

In some embodiments, circuit 300 enters the calibration state every fixed number of samples, e.g., every M samples, so that a constant calibration period $T_c$=T*M elapses between calibrations 530. M may be chosen based on the following considerations. M may be large enough to enable DAC 350 (which may be a relatively slow device) to prepare its output. Although DAC output 520 is shown as a ramp in FIG. 5, it is understood that a real DAC provides successive output values that more closely resemble a step function, with a certain amount of time associated with preparing each step value. On the other hand, the larger that M is, the slower that calibration proceeds overall, i.e., the longer it takes to calibrate with all possible quantization levels over the dynamic range. M may be greater than 1,000, i.e., over 1,000 samples may occur between calibrations. Another consideration for M may be the speed or rate at which the calibration values need to be updated, in order to track the changes occurring in the system that may affect the calibration stability and accuracy. The larger the M, the narrower the tracking or loop bandwidth of the calibration loop, i.e. the ability to track faster changes is reduced, and vice versa. For example, with sampling clock of 10 GHz and M=10,000, the calibration update rate is 1 MHz and the calibration loop will be able to track changes slower than 1 MHz.

The calibration period may be variable (or randomized) in other embodiments. Varying (e.g., randomizing) the calibration period may avoid interruption to a spectrum of the sampled signal, which interruption may lead to undesirable spurious power components (spurs) at harmonics. Such variable or randomized calibration may be implemented using techniques known to one of ordinary skill in the art using various disclosed embodiments, e.g., by controlling switch 332 with a suitable control signal.

In some embodiments (not shown in FIG. 5), circuit 300 may be fully calibrated prior to any sampling, e.g., a first sample 510-1 may occur only after a last calibration value 520-$j$ has been presented to ADC 340. In other words, all possible input values over a dynamic range may be presented to ADC 340 in the calibration state (with switch 332 coupling ADC 340 to DAC 350 via resistor 352) prior to any sampling (i.e., prior to ADC 340 being coupled to node B having an input voltage to be sampled). In other embodiments, as shown in FIG. 5, calibrations may occur between samples. Circuit 300 may ultimately reach a steady-state corresponding to all calibration values having been presented after some number of samples. In some embodiments, calibrations occur on a recurrent basis after initial calibrations have been achieved.

In various embodiments, accelerated processing is provided via a "fast attack," herein referring to an abbreviated sampling state that does not wait for the voltage to settle, a "fast release," herein referring to an abbreviated reset state in which the voltage is not allowed to settle to zero, or both. As used herein, a "traditional attack" refers to a sampling state that waits for the voltage to settle as in known techniques, and a "traditional release" refers to a reset state in accordance with known techniques in which the voltage is allowed to settle to zero during discharge.

A fast attack may be coupled with a "traditional release" as follows. Circuit 300 may be calibrated, e.g., as described above in the context of FIG. 5, to present all possible values in a dynamic range as inputs to ADC 340. Because the "truth" data entering ADC 340 is known, the output of ADC 340 may be compared with the truth data to provide a sampling error $\epsilon_s$. For example, if the output of DAC 350 is 100 mV, accurately presenting to the ADC one of the possible discrete (quantized) values from the ADC bit or step resolution space, and the output of ADC 340 is 105 mV, representing another ADC's discrete value or step, then the sampling error $\epsilon_s$ may be determined to be 5 mV. This error may represent several LSBs. The sampling error may be stored in DSP 360 (e.g., in memory 360 therein) in a table indexed by ADC output values. When circuit 300 is not in calibration mode, i.e., during normal operation of ADC 340, outputs of the ADC may be compensated by retrieving from the sampling error table of memory 362 a corresponding sample error term $\epsilon_s[n]$ and subtracting it from the pre-settled voltage (e.g., the voltage corresponding to point 430 that is prior to settling). Represented mathematically, the ADC output may be compensated as follows: $x[n]=x_s[n]-\epsilon_s[n]$, where $x[n]$ is a corrected voltage at the $n^{th}$ n sampling period, $x_s[n]$ is an uncorrected output of ADC 340, and $\epsilon_s[n]$ is a pre-stored sampling error retrieved from DSP 360. Such compensation via subtraction may be implemented at DSP 360 via known techniques, e.g., for performing arithmetic operations using processor 361 and memory 362. It should be understood by one of ordinary skill in the art that the sign convention may be reversed, e.g., the sampling error may be considered to be –5 mV, in which case error compensation may involve adding instead of subtracting sampling errors.

In some embodiments, a fast attack is employed in conjunction with a fast release. In that case, a residual nonzero reset error (e.g., $\epsilon_0[n]$ in FIG. 4 caused by not allowing the voltage to settle to zero during the reset state) leads to error in the next sampling state, e.g., by shifting pre-settled voltage 460 higher than it otherwise would be. In other words, with fast attack and fast release, compensating during given period comprises compensating for a sampling error during that period as well as compensating for a reset error during the previous period. Expressed mathematically, compensation proceeds as follows: $x[n+1]=x_s[n+1]-\epsilon_0[n]-\epsilon_s[n+1]$, where $x[n+1]$ is a corrected voltage at the $(n+1)^{th}$ sampling period, $x_s[n+1]$ is an uncorrected output of ADC 340, and $\epsilon_0[n]$ and $\epsilon_s[n+1]$ are pre-stored reset and sampling errors, respectively, that correspond to the $n^{th}$ and $(n+1)^{th}$ sampling periods, respectively, and that are retrieved from DSP 360. Expressed in terms of the example of FIG. 4, compensating the error associated with pre-settled voltage 460 (i.e., with $x_s[n+1]$) involves subtracting from that voltage a contribution due to the fast attack during that sampling state (i.e., $\epsilon_s[n+1]$ as well as a contribution due to starting that sampling state with a bias (i.e., $\epsilon_0[n]$, the residual error from the previous fast release or reset cycle). In other words, inter-symbol interference is present and corrected in some embodiments, as a reset error associated with a given sample exhibits dependence on past samples. Computation of reset error $\epsilon_0[n]$ is described below.

In some embodiments, reset errors may be determined during calibration by charging to a known value, e.g., by coupling ADC 340 to DAC 350 via resistor 352 and allowing the voltage to settle, and then resetting (coupling ADC 340 to ground to discharge from the known value). In other words, traditional attack followed by fast release provides such calibration, as any residual voltage at the end of the reset period (which may be nonzero because adequate time for settling to zero is not provided via fast release) may be attributed to the fast release and may be stored in a reset error table of memory 362 for future retrieval. DAC outputs spanning a dynamic range may be provided as various starting points from which to discharge. For example, with a 10-bit ADC 340, circuit 300 may fully charge (i.e., traditional attack) to each of 1024 different known voltage levels and then discharge, with 1024 residual voltages recorded in a reset error table.

In some embodiments, a traditional attack is employed in conjunction with a fast release. In other words, a sampled voltage is allowed to settle during the sampling state like at point 230 in FIG. 2, but the next reset state is accelerated (abbreviated), i.e., the voltage does not settle to zero at the end of that reset state. In such a case, error compensation comprises compensating for a reset error (e.g., $\epsilon_0[n]$ term) but not for a sampling error i.e., $x[n+1]=x_s[n+1]-\epsilon_0[n]$.

Referring to FIG. 5, each time a calibration occurs, i.e., at calibration events 530-1, 530-2, . . . , 530-$j$, data is lost in some embodiments because a sample is not recorded. In other words, because of the online configuration shown in FIG. 3 in which ADC 340 is disconnected from the input voltage at node B during calibrations, certain sample data are not available. To address such missing data, various techniques may be used in embodiments. One approach is not to do anything but rather to ignore the missing data, which may be a practical solution if the effects of missing data are negligible. For example, with a sample rate of 10 Gb/s, assuming a calibration occurs every 10,000 samples, the error due to missing sample will have power of $10 \cdot \log(10,000)=80$ dB below the signal power, i.e. it may cause a spectral spur 80 dB below the signal. Missing data, especially at regular intervals, may negatively impact the sampled output power spectrum, as shown in the example above. In many applications small errors or spurs may be acceptable. If needed, to reduce or eliminate this error or spur, missing data may be addressed in various embodiments by filling-in an approximated or estimated value, for instance by repetition of a sample immediately preceding a missing sample or by interpolation, e.g., linear or higher order interpolation using adjacent samples or any other interpolation technique known to one of ordinary skill in the art.

Figure 6:
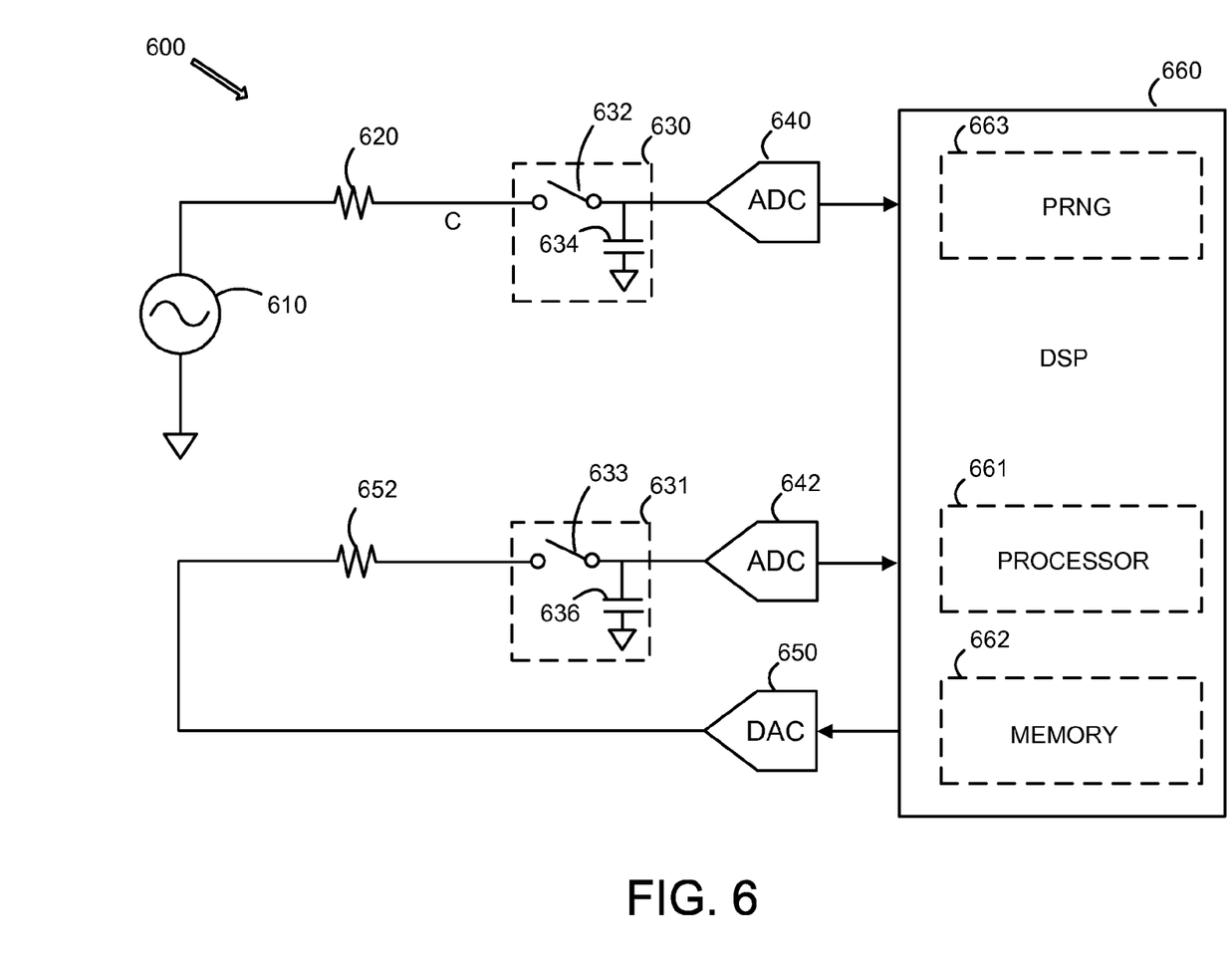
FIG. 6 is a circuit diagram in accordance with an exemplary embodiment in an offline sample-and-hold (SH) configuration.

FIG. 6 is a circuit diagram in accordance with an exemplary embodiment in an offline sample-and-hold (SH) configuration. Circuit 600 includes a voltage source 610 with a resistor 620 in series, a primary SH circuit 630, a first ADC 640, and a DSP 660 having a processor 661, a memory 662, and optionally a pseudorandom number generator (PRNG) 663. SH circuit 630 includes a capacitor 634 and a switch 632 that couple ADC 640 to node C having an analog input voltage (i.e., places the primary SH circuit 630 in a sampling state), a holding state (open position), or a reset state (a ground position, not shown in FIG. 6). Circuit 600 also includes a second ADC 642 that has substantially similar or identical properties as the first ADC 640, an auxiliary SH circuit 631, a resistor 652, and a DAC 650. Auxiliary SH circuit 631, which has substantially similar or identical properties as main SH circuit 630, includes a capacitor 636 and a switch 633 that places the auxiliary SH circuit 631 in a calibration state (comprising sampling state and holding state) or a reset state. Capacitors 634 and 636 may have equal capacitances, and ADCs 640 and 642 may be identically configured. Thus, with two ADCs 640, 642 and main and auxiliary SH circuits 630, 631 operating in parallel, circuit 600 may perform calibration without interruption to normal sampling, i.e., may perform offline calibration. In the offline configuration, the properties of one circuit (ADC 640) are estimated by observing another circuit (ADC 642). Similar principles regarding calibration apply as those described above in the context of online calibration, i.e., various combinations of fast or slow attack and release may be used, and appropriate errors (sampling errors and/or reset errors) may be determined, stored, retrieved, and compensated. However, calibration may be performed in real time with circuit 600 without losing any samples. DSP 660 may be simplified relative to DSP 360, as interpolation is not necessary, and a single reference clock may be employed (i.e., not separate clocks for sampling and calibration). Additionally, because the spectrum of the main signal is not interrupted, there is no need for randomization of either the sequence of DAC outputs presented or of the calibration period (time between calibrations), thus reducing circuit complexity because a PRNG is not needed. Thus, a simple linear sequence (i.e., ramp) may be employed without detriment. On the other hand, circuit 600 employs more circuitry than circuit 300.

The duty cycle associated with a sampling period, i.e., the relative durations of sampling and reset states, may vary in various embodiments. In some embodiments, the duty cycle may be 50%, i.e., the sampling state may end halfway through a sampling period.

Figure 7:
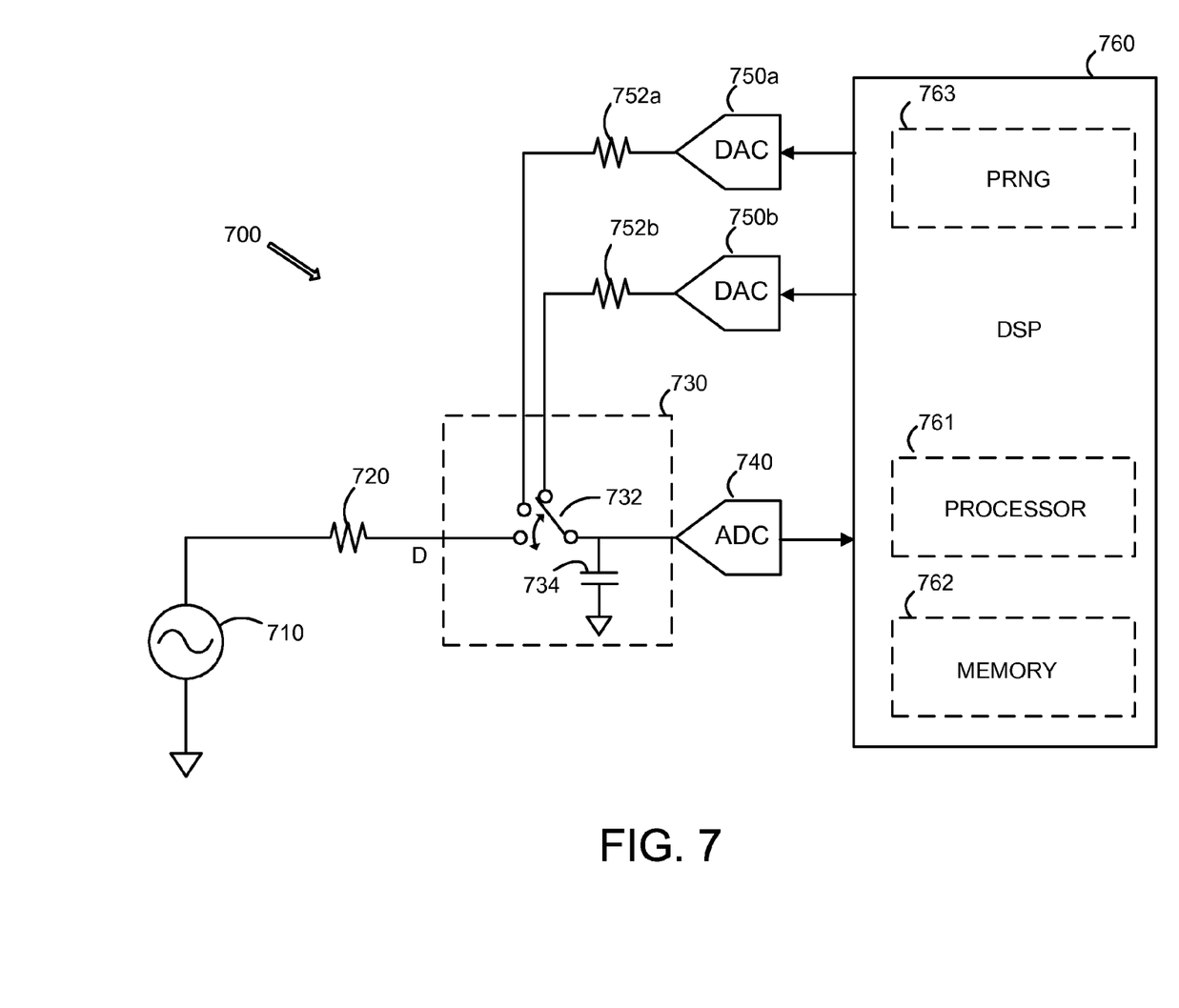
FIG. 7 is a circuit diagram in accordance with an exemplary embodiment in an online track-and-hold (TH) configuration.

FIG. 7 is a circuit diagram in accordance with an exemplary embodiment in an online track-and-hold (TH) configuration. A TH circuit charges like a SH circuit during a sampling state and stores the charge during the holding state, but does not reset, i.e., voltage is not allowed to discharge to zero or nearly zero. Circuit 700 has a voltage source 710 and a resistor 720 in series, a TH circuit 730, and an ADC 740. TH circuit 730 includes a capacitor 734 and a switch 732 that places the TH circuit 730 in a sampling state, by coupling ADC 740 to node D having an analog input voltage to be sampled, followed by a holding state (the switch 732 is placed in open position, not shown in FIG. 7 for simplicity), or in a calibration state, by coupling ADC 740 to one of the DACs 750a, 750b via one of the corresponding resistors 752a, 752b.

Unlike the pulse-like voltage waveform obtained via sample-and-hold in which sampling is followed by a reset to zero (or nearly zero) voltage, track-and-hold results in a step-like waveform, as voltages are successively "attacked" at different values. Because there is no reset state, two parameters define a transition from one sampling state to another: the voltage before the transition and the voltage after the transition. Fast attack (accelerated sampling) may be provided in some embodiments, but fast release is not an option because there is no release with track-and-hold. Thus, there is no reset error (i.e., no $\epsilon_0[n]$) as above with sample-and-hold, and only one error is compensated in some embodiments: a sampling error that is a function of two variables ("before" and "after" voltages). Accordingly, DACs 750a and 750b may be instructed by DSP 760 to provide to ADC 740 various before-and-after voltage pairs during calibration. The reason that two DACs are provided rather than one is that a single DAC may not have sufficient time to prepare a next ("after") voltage immediately after a transition. Switch 732 may selectively couple ADC 740 to one of the DACs (an output of which is fully prepared, given enough time) or to the other DAC (an output of which is also fully prepared) to test all combinations. For example, with a 10-bit ADC 740, $1024*1024=2^{20}$ values may be stored, e.g., in a two-dimensional table of memory 662, with the table having dimensions 1024 by 1024. During normal sampling (i.e., not calibration), pre-settled voltages from a previous sampling period and the current sampling period are used to look up (retrieve) a sampling error in the two-dimensional sampling error table, and such a sampling error is subtracted from the current pre-settled voltage.

Figure 8:
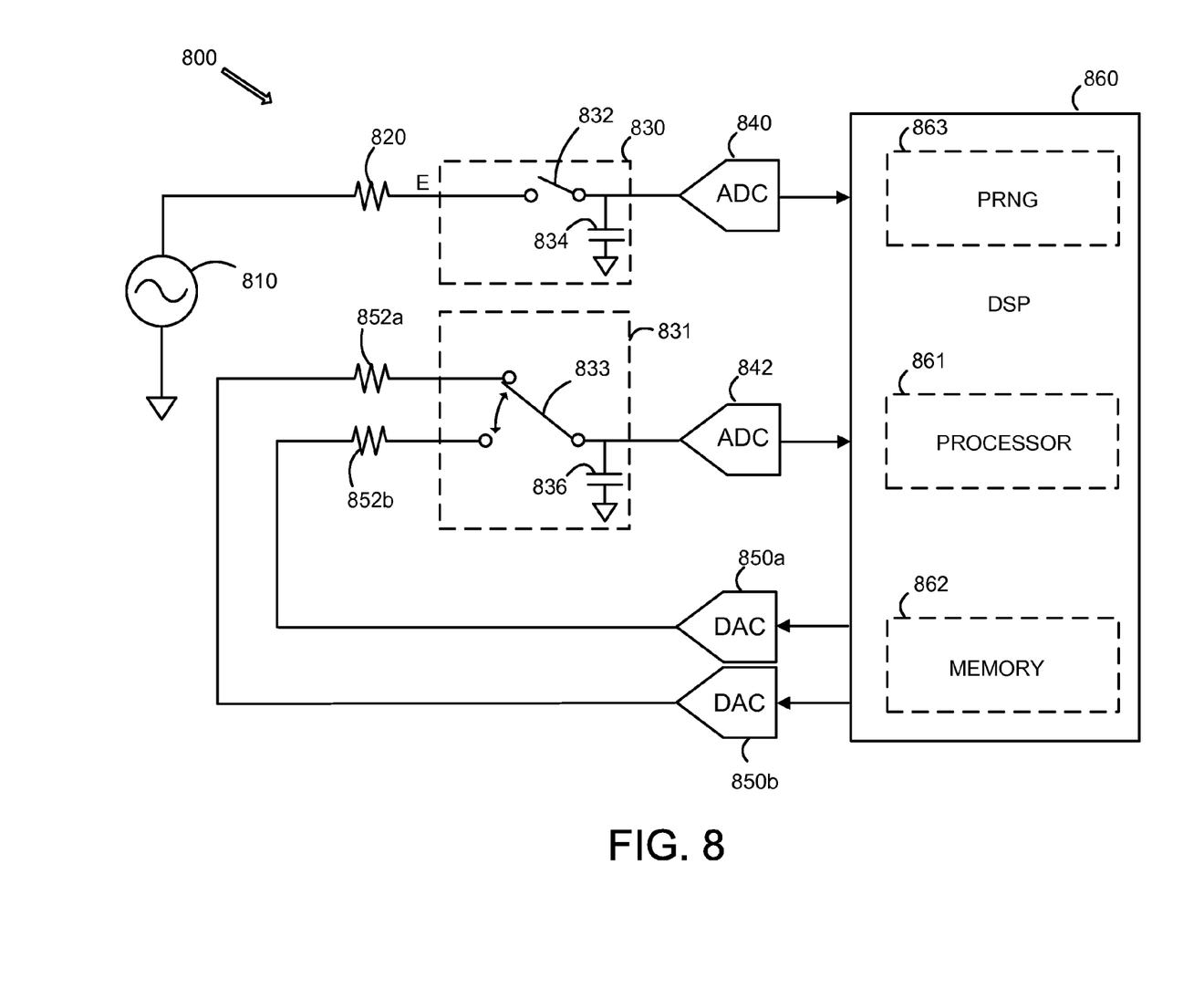
FIG. 8 is a circuit diagram in accordance with an exemplary embodiment in an offline track-and-hold (TH) configuration.

FIG. 8 is a circuit diagram in accordance with an exemplary embodiment in an offline track-and-hold (TH) configuration. Circuit 800 has a voltage source 810 with a resistor 820 in series, a primary TH circuit 830, a first ADC 840, and a DSP 860 having a processor 861, a memory 862, and optionally a PRNG 863. TH circuit 830 includes a capacitor 834 and a switch 832 as in a known TH circuit. Circuit 800 also includes a second ADC 842 and an auxiliary TH circuit 831 having a capacitor 836 and a switch 833. Circuit 800 also includes resistors 852a and 852b and DACs 850a and 850b as shown in FIG. 8. Auxiliary TH circuit 831 operates in parallel with primary TH circuit 830, like in circuit 600, to provide real time calibration using known voltage pairs provided by DACs 850a and 850b, as with circuit 700 described above. A two-dimensional table of sampling errors indexed by pre-settled voltages before and after a sampling transition is provided at DSP 860, populated during calibration, and accessed during normal sampling for error compensation.

Typically, settling behavior associated with an ADC is nonlinear, possibly also having some linear content. In some embodiments, settling behavior is modeled and expressed analytically, and error correction involves including a formula by which the error is calculated and corrected. In this embodiment, instead of by calibration, the error is computed by solving a formula that is modeled according to the sampler's behavior. The computation can be executed in real time, on line, or pre-computed and stored in a table similar to the calibration table.

Figure 9:
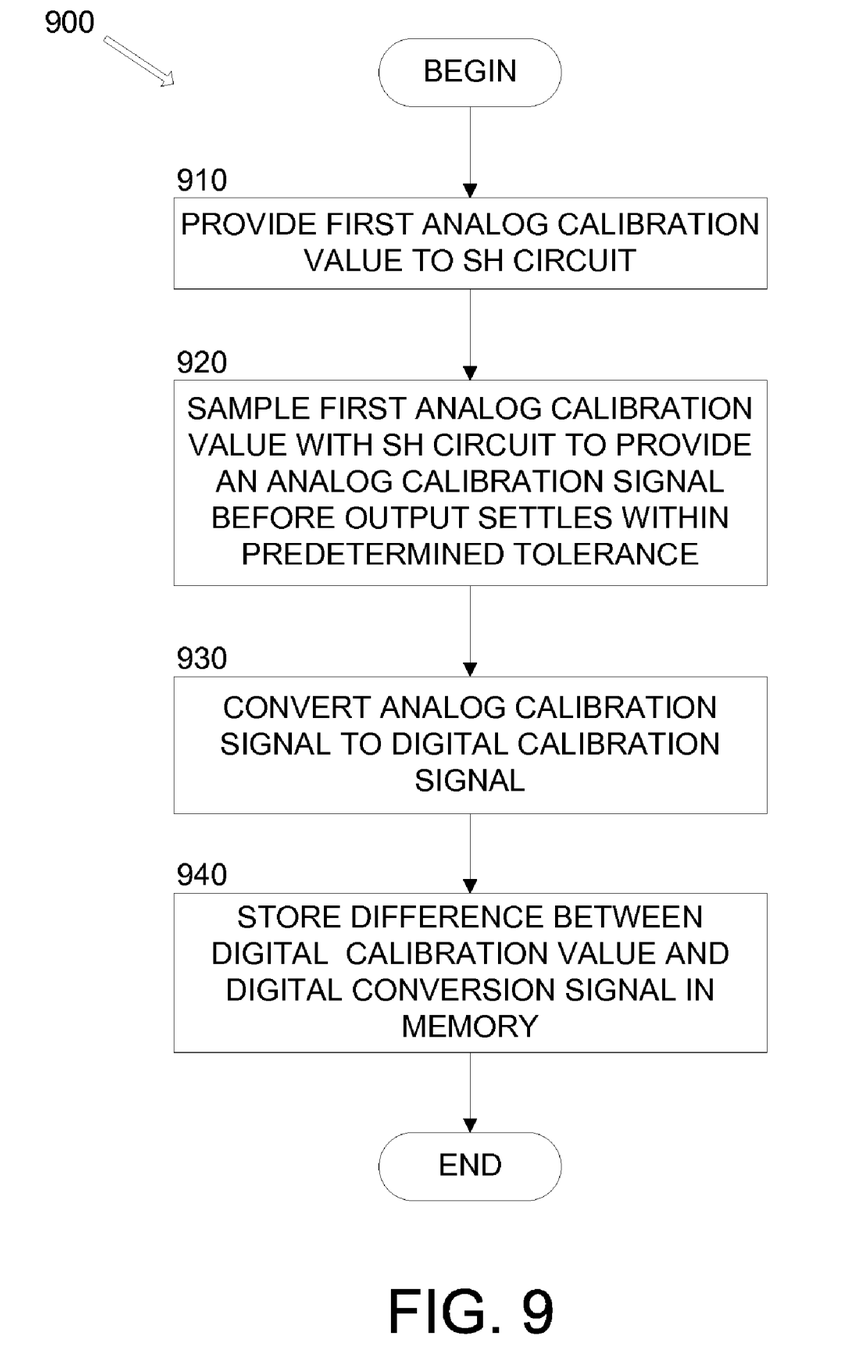
FIG. 9 is a flow diagram in accordance with an exemplary embodiment corresponding to calibration supporting accelerated processing using a fast attack.

FIG. 9 is a flow diagram in accordance with an exemplary embodiment corresponding to calibration supporting accelerated processing using a fast attack. After process 900 begins, an analog calibration value having a known accuracy is provided (910) to a sample-and-hold (SH) circuit. The analog calibration value is sampled (920) with the SH circuit to provide an analog calibration signal before an output of the SH circuit settles within a predetermined tolerance. The analog calibration signal is converted (930) to a digital conversion signal with the ADC. A difference between the digital calibration value and the digital conversion signal is stored (940) in a memory.

Figure 10:
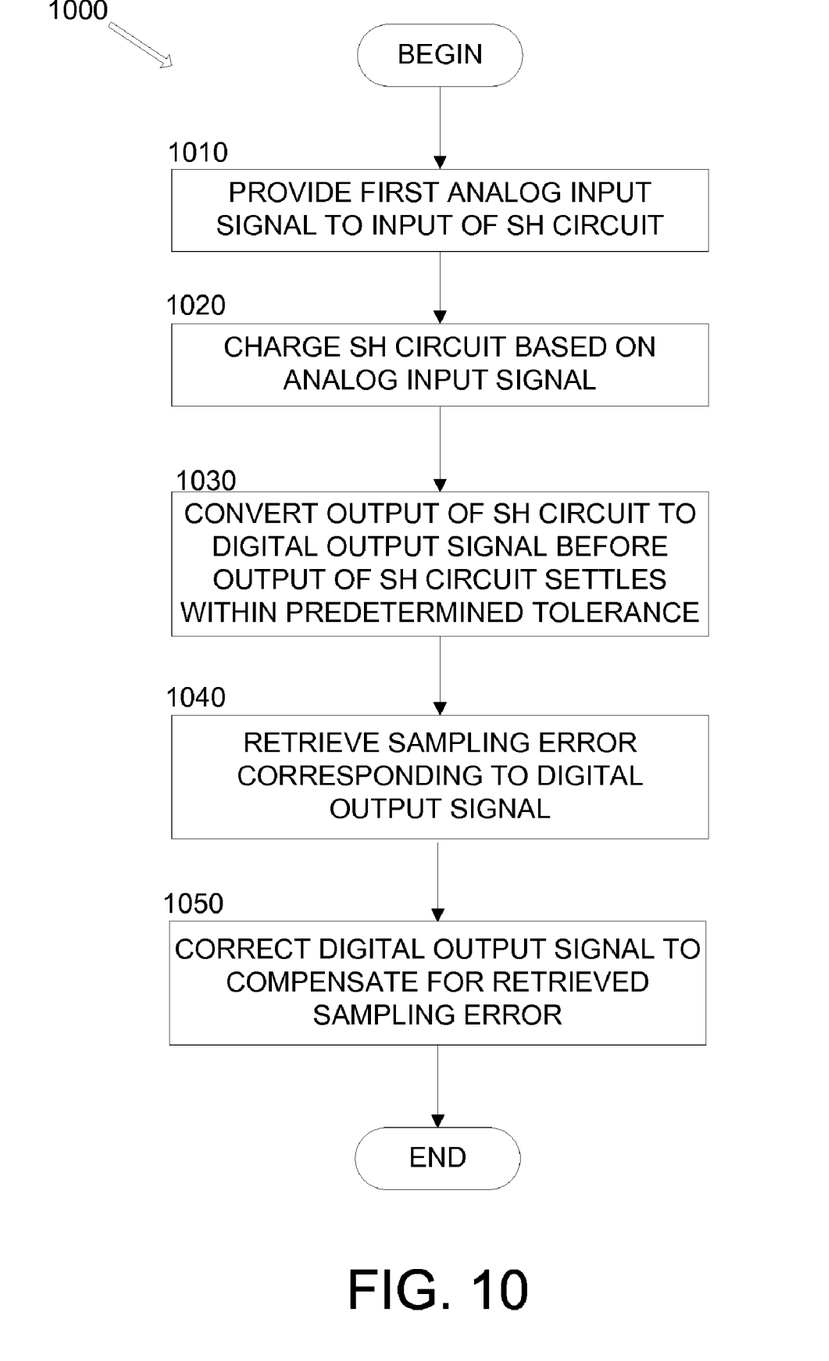
FIG. 10 is a flow diagram in accordance with an exemplary embodiment corresponding to accelerated processing using a fast attack.

FIG. 10 is a flow diagram in accordance with an exemplary embodiment corresponding to accelerated processing using a fast attack. After process 1000 begins, and analog input signal to be digitized is provided (1010) to an input of a sample-and-hold (SH) circuit. The SH circuit is charged (1020) based on the analog input signal. An output of the SH circuit is converted (1030) to a digital output signal at a pre-settled time before the output of the SH circuit settles within a predetermined tolerance. A sampling error corresponding to the digital output signal is retrieved (1040), and the digital output signal is corrected (1050) to compensate for the retrieved sampling error. In one embodiment the pre-settled time (measured from the start of its sampling interval) at which instant the analog input signal is converted to digital value is substantially the same as the pre-settled time (measured from the start of its sampling interval) at which instant the calibration signal is converted to digital value.

Figure 11:
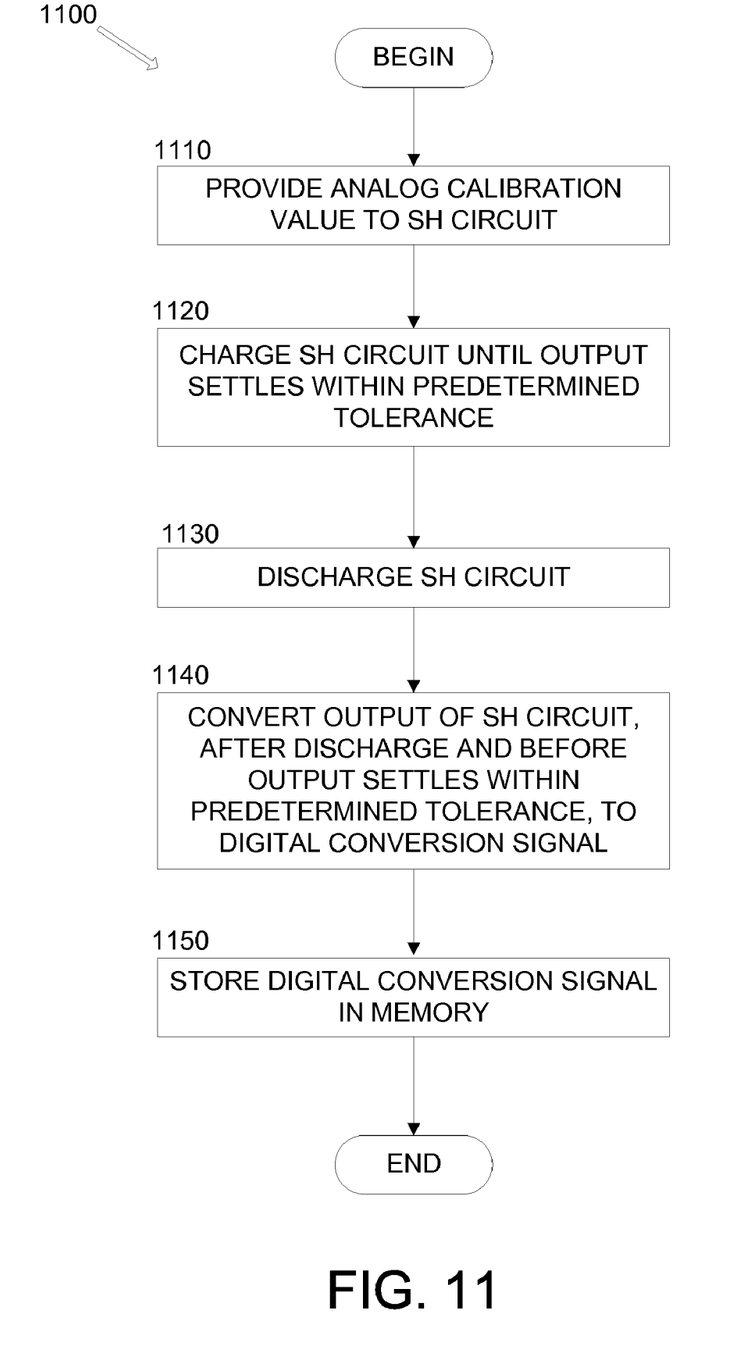
FIG. 11 is a flow diagram in accordance with an exemplary embodiment corresponding to calibration supporting accelerated processing using a traditional attack and a fast release.

FIG. 11 is a flow diagram in accordance with an exemplary embodiment corresponding to calibration supporting accelerated processing using a traditional attack and a fast release. After process 1100 begins, an analog calibration value is provided (1110) to a sample-and-hold (SH) circuit. The SH circuit is charged (1120) until an output of the SH circuit settles within a predetermined tolerance. The SH circuit is discharged (1130). The output of the SH circuit is converted (1140), after discharging and before the output of the SH circuit settles within the predetermined tolerance, to a digital conversion signal with the ADC. The digital conversion signal is stored (1150) in a memory of a digital signal processor (DSP).

Figure 12:
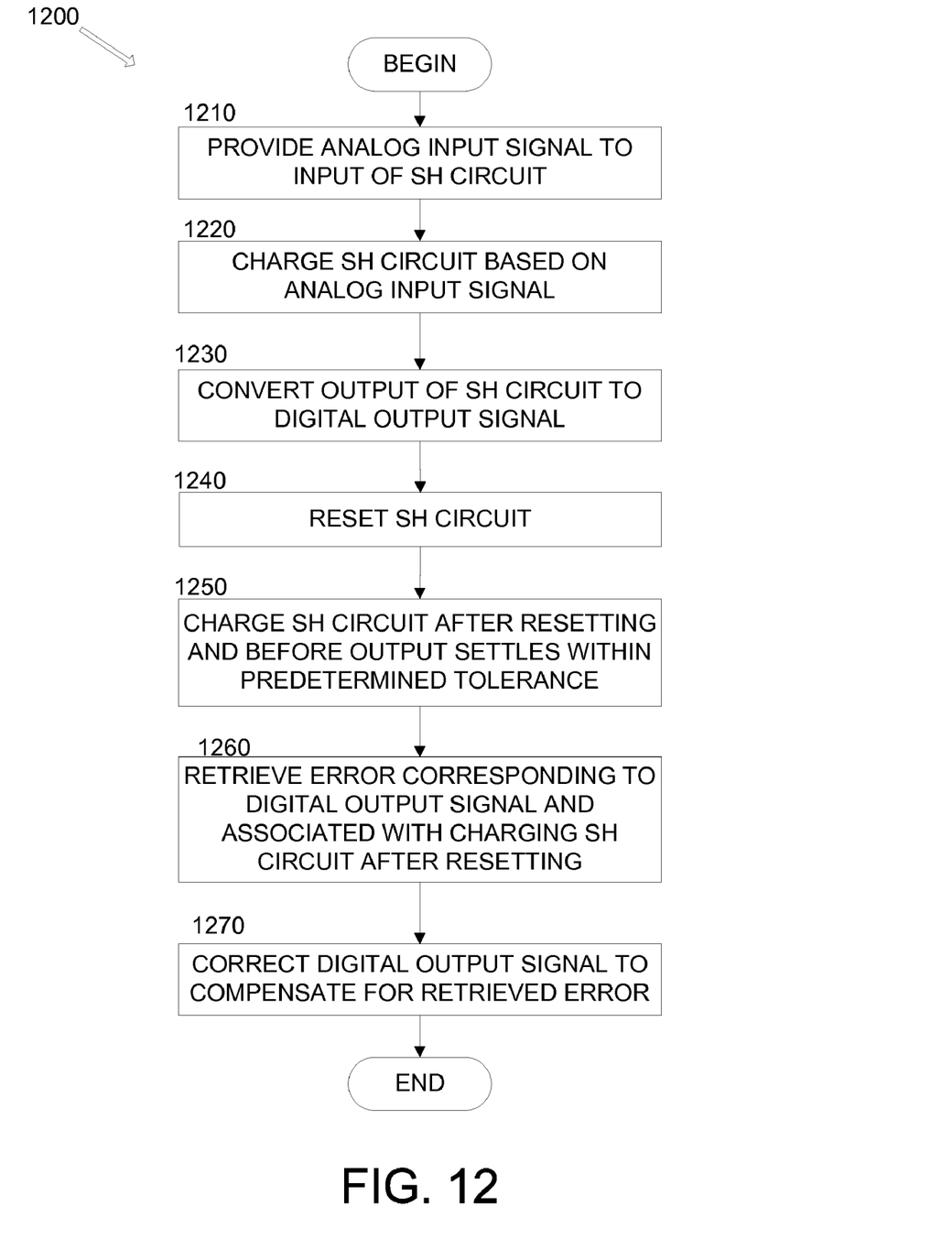
FIG. 12 is a flow diagram in accordance with an exemplary embodiment corresponding to accelerated processing using a traditional attack and a fast release.

FIG. 12 is a flow diagram in accordance with an exemplary embodiment corresponding to accelerated processing using a traditional attack and a fast release. After process 1200 begins, an analog input signal is provided (1210) to an input of a sample-and-hold (SH) circuit. The SH circuit is charged (1220) based on the analog input signal. An output of the SH circuit is converted (1230) to a digital output signal. The SH circuit is reset (1240) at an end of the sampling state. The SH circuit is charged (1250) after resetting and before the output of the SH circuit settles within the predetermined tolerance. An error is retrieved (1260); the error corresponds to the digital output signal and is associated with the charging the SH circuit after resetting. The digital output signal is corrected (1270) to compensate for the retrieved error.

Although examples are illustrated and described herein, embodiments are nevertheless not limited to the details shown, since various modifications and structural changes may be made therein by those of ordinary skill within the scope and range of equivalents of the claims.

What is claimed is:

1. A circuit comprising:
 (a) an input node having a variable analog input voltage;
 (b) a first analog to digital converter (ADC);
 (c) a first sample-and-hold (SH) circuit comprising a first capacitor, coupled to the first ADC, and a first switch that switches the first SH circuit, based on a control signal, between a sampling state, a holding state and a reset state by coupling the first ADC and the first capacitor to the input node, the open circuit or a ground node, respectively;
 (d) a second ADC;
 (e) a digital to analog converter (DAC);
 (f) a second SH circuit coupled to the second ADC, the second SH circuit comprising a second capacitor, coupled to the second ADC, and a second switch, controlled by the control signal and that switches the second SH circuit between a calibration state, a holding state and a reset state by coupling the second ADC and the second capacitor to the DAC, the open circuit or the ground node, respectively; and
 (g) a digital signal processor (DSP) coupled to the first and second ADCs and the DAC, the DSP comprising:
  (i) a control logic that provides at least one digital calibration value to the DAC,
  (ii) a memory that stores at least one error associated with the second ADC, and
  (iii) a correction module that corrects an output of the first ADC based on the at least one stored error.

2. A circuit comprising:
 (a) an input node having a variable analog input voltage;
 (b) a first analog to digital converter (ADC);
 (c) a first track-and-hold (TH) circuit comprising a first capacitor, coupled to the first ADC, and a first switch that switches the first TH circuit, based on a control signal, into a sampling state or holding state by coupling the first ADC and the first capacitor to the input node or the open circuit, respectively;
 (d) a second ADC;
 (e) first and second digital to analog converters (DACs);
 (f) a second TH circuit coupled to the second ADC, the second TH circuit comprising a second capacitor, coupled to the second ADC, and a second switch, controlled by the control signal and that switches the second SH circuit in a calibration state or holding state by coupling the second ADC and the second capacitor to one of the DACs or to the open circuit, respectively; and
 (g) a digital signal processor (DSP) coupled to the ADCs and the DACs, the DSP comprising:
  (i) a control logic that provides at least one digital calibration value to each of the DACs,
  (ii) a memory that stores at least one error associated with the second ADC, and
  (iii) a correction module that corrects an output of the first ADC based on the at least one stored error.

* * * * *